(12) United States Patent
Huang

(10) Patent No.: US 7,269,001 B2
(45) Date of Patent: Sep. 11, 2007

(54) ELECTRONIC DEVICE WITH ROTATING SUPPORTING MEMBER

(75) Inventor: Kuo-Wei Huang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/321,142

(22) Filed: Dec. 29, 2005

(65) Prior Publication Data
US 2007/0010130 A1    Jan. 11, 2007

(30) Foreign Application Priority Data
May 24, 2005    (CN)    ......................... 2005 1 0034865

(51) Int. Cl.
*H05K 5/00*    (2006.01)
(52) U.S. Cl. ............... 361/683; 248/188.8; 248/346.01
(58) Field of Classification Search ................ 439/131, 439/534; 361/683, 724; 248/346.01, 349.1, 248/188.8
See application file for complete search history.

(56) References Cited

U.S. PATENT DOCUMENTS

| | | | | |
|---|---|---|---|---|
| 5,388,792 | A * | 2/1995 | Hastings et al. ......... | 248/188.1 |
| 6,311,941 | B1 * | 11/2001 | Feldmeyer ............... | 248/188.8 |
| 6,603,656 | B2 * | 8/2003 | Cho et al. .................... | 361/683 |
| 2003/0075664 | A1 * | 4/2003 | Helot et al. ............ | 248/346.01 |
| 2004/0164216 | A1 * | 8/2004 | Chen ..................... | 248/346.01 |

* cited by examiner

*Primary Examiner*—Michael C. Zarroli
(74) *Attorney, Agent, or Firm*—Morris Manning & Martin LLP; Tim Tingkang Xia, Esq.

(57) ABSTRACT

An electronic device includes a case (20) and a supporting member (10). The case includes a bottom wall (50) defining a receiving recess (54). A receiving hole (56) is defined in the bottom wall at the receiving recess. The supporting member includes a main portion (12), a connecting member (14) rotatably received in the receiving hole, and at least one protruding portion (16) located at a periphery of the connecting member. The main portion includes two locating protrusions (126). The case includes two first sockets (500) and two second sockets (502). The locating protrusions are selectively received in either the first sockets or the second sockets. When the electronic device is used in a horizontal position, the supporting member is fully received in the recess of the case; and when the electronic device is stood in an upright position, the supporting member is perpendicular to the recess of the case.

16 Claims, 7 Drawing Sheets

ELECTRONIC DEVICE WITH ROTATING SUPPORTING MEMBER

BACKGROUND

1. Field of the Invention

The present invention pertains to electronic devices typically used on desktops or tabletops, and particularly to an electronic device with a rotating supporting member.

2. General Background

Electronic devices such as access points (APs), modems, and so on, are gaining in popularity. Many of these electronic devices can be placed in an upright position or in a horizontal position on a desktop or tabletop. When an electronic device needs to be placed in an upright position, an additional supporting member is conventionally used for supporting the electronic device and preventing the electronic device from falling down or out of position. However, the supporting member and the electronic device are generally not integrated, which can lead to problems in packaging or transportation. Furthermore, the separate supporting member is liable to be misplaced. Some conventional devices have equipped an attachable supporting member, however, their structures are usually complicated and difficult to manufacture, especially in the molding process.

Therefore, a heretofore unaddressed need exists in the industry to resolve the aforementioned deficiencies and inadequacies.

SUMMARY

In an exemplary embodiment, an electronic device comprises a case and a supporting member. The case comprises a bottom wall. The bottom wall comprises a receiving recess. A receiving hole is defined in the bottom wall at the receiving recess. The supporting member comprises a main portion, a connecting member extending from a middle of the main portion, and at least one protruding portion. The connecting member is rotatably received in the receiving hole and movably engaged with an inside of the bottom wall. The at least one protruding portion is located at a periphery of the connecting member. The main portion comprises a pair of opposite locating protrusions. The bottom wall at the receiving recess comprises a pair of transversely aligned first sockets and a pair of longitudinally aligned second sockets. The locating protrusions are selectively received in either the first sockets or the second sockets. When the electronic device is used in a horizontal position on a desktop or tabletop, the supporting member is fully received in the recess of the case, with the locating protrusions received in the second sockets. When the electronic device is in an upright position on a desktop or tabletop, the supporting member is perpendicular to the bottom wall of the case, with the locating protrusions received in the first sockets.

Other advantages and novel features will become more apparent from the following detailed description when taken in conjunction with the accompanying drawings, in which:

DETAILED DESCRIPTION OF THE EMBODIMENTS

Figure 1:
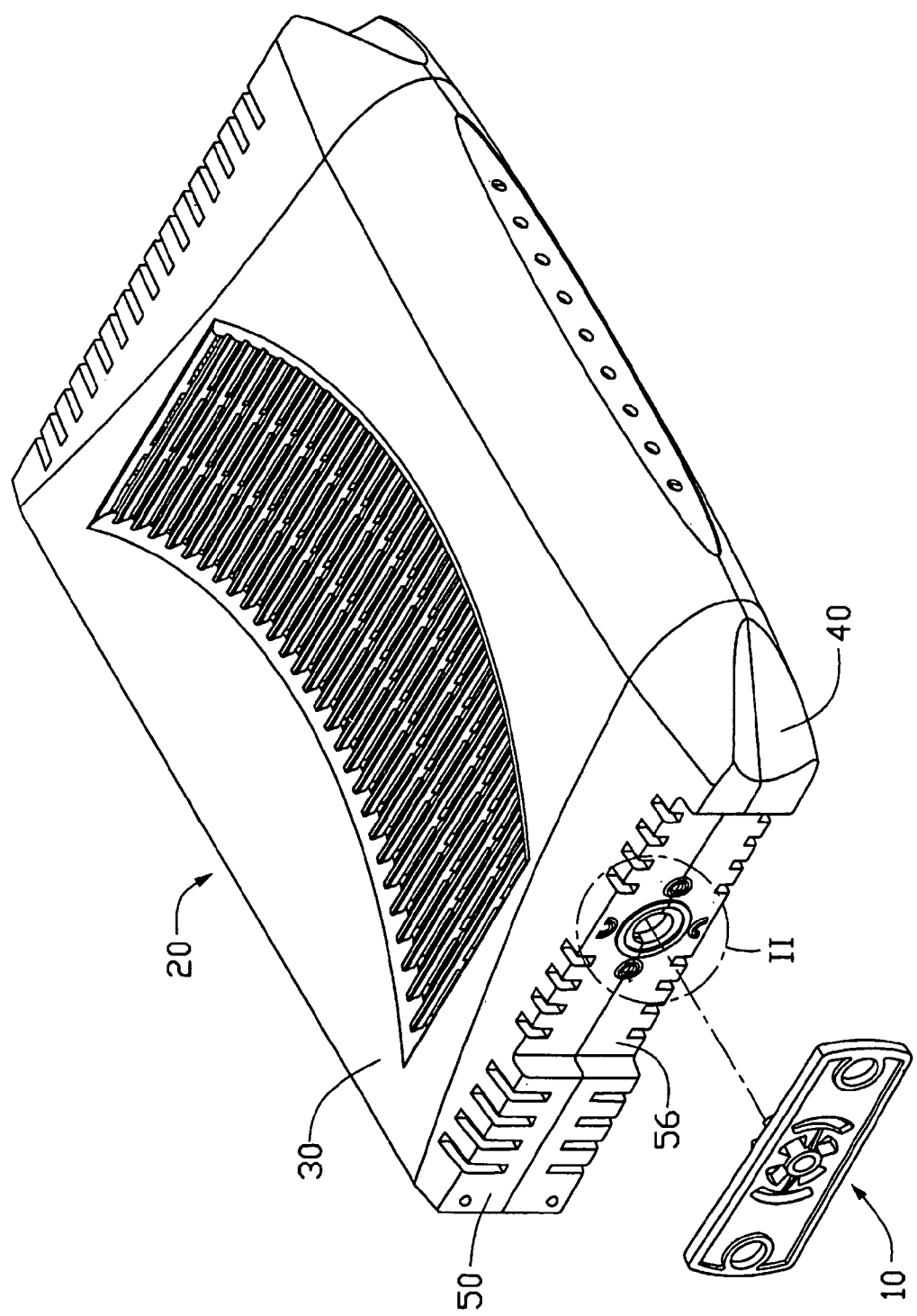
FIG. 1 is an exploded, isometric view of an electronic device in accordance with an exemplary embodiment of the present invention, the electronic device comprising a case and a supporting member.

Referring to FIG. 1, an electronic device in accordance with the exemplary embodiment of the present invention comprises a supporting member 10 and a case 20. The electronic device may for example be a network communication device such as a modem or an access point (AP). The case 20 comprises a cover 30 and a base 40.

Figure 3:
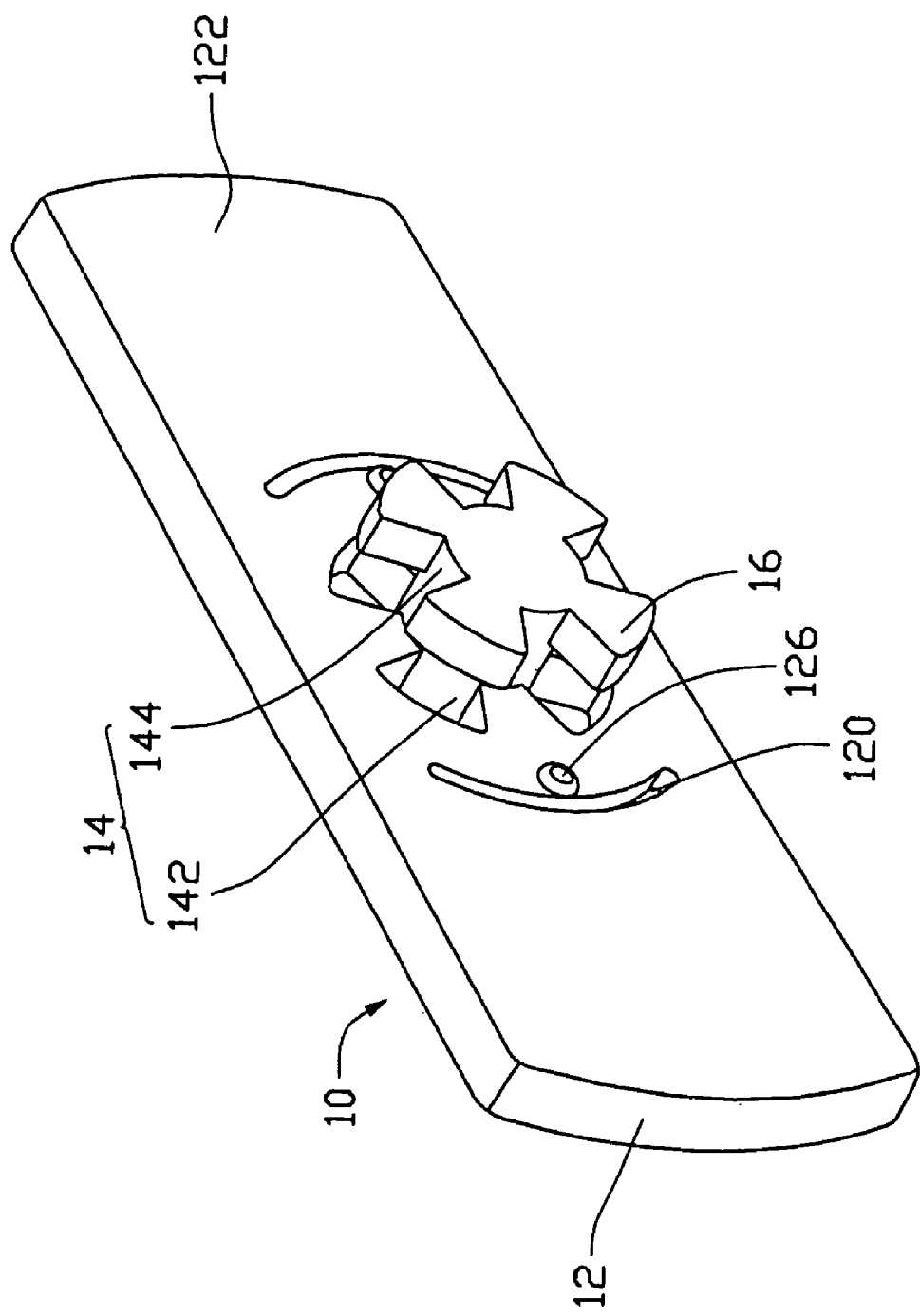
FIG. 3 is an enlarged view of the supporting member of the electronic device of FIG. 1, but viewed from another aspect.

Referring also to FIG. 3, the supporting member 10 is rotatably attached to the case 20. The supporting member 10 comprises a main portion 12, a connecting member 14 extending from a middle of the main portion 12, and four protruding portions 16 protruding from a distal end of the connecting member 14. The main portion 12 comprises a pair of opposite locating protrusions 126 protruding from a first face 122 thereof, and a pair of arc-shaped slots 120. The locating protrusions 126 are positioned on opposite sides of the connecting member 14. The slots 120 are also positioned on opposite sides of the connecting member 14, adjacent to the locating protrusions 126. The slots 120, allow the main portion 12 at the locating protrusions 126 to resiliently deform. The connecting member 14 comprises a neck portion 142 and an end portion 144. Each of the protruding portions 16 has a fan blade shape, and is located at a periphery of the end portion 144. In alterative embodiments of the present invention, each protruding portion 16 can have a truncated sector shape, a square shape, a generally trapezoidal shape, and so on. In another alterative embodiment of the present invention, the protruding portions 16 can instead be a single, annular protruding portion. The protruding portions 16 are used for preventing the supporting member 10 from disengaging from the case 20.

Figure 2:
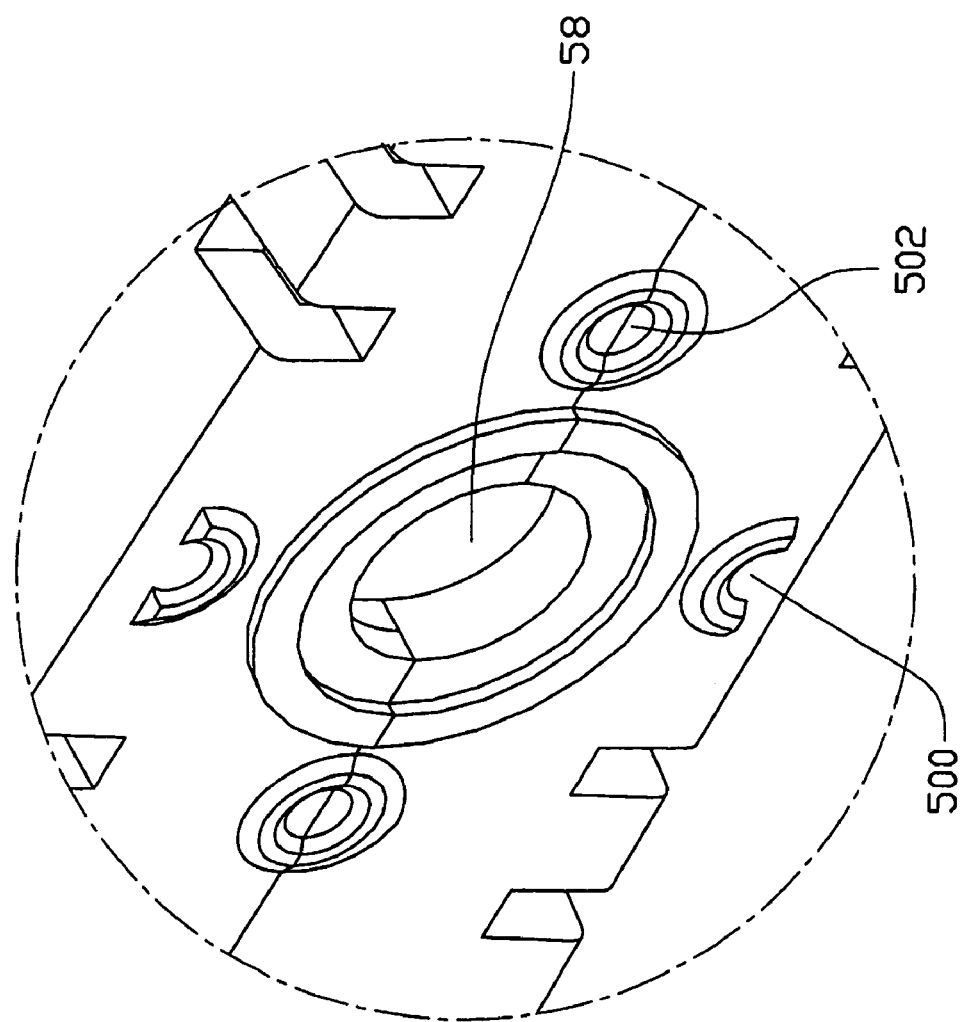
FIG. 2 is an enlarged view of circle portion II of FIG. 1.
Figure 4:
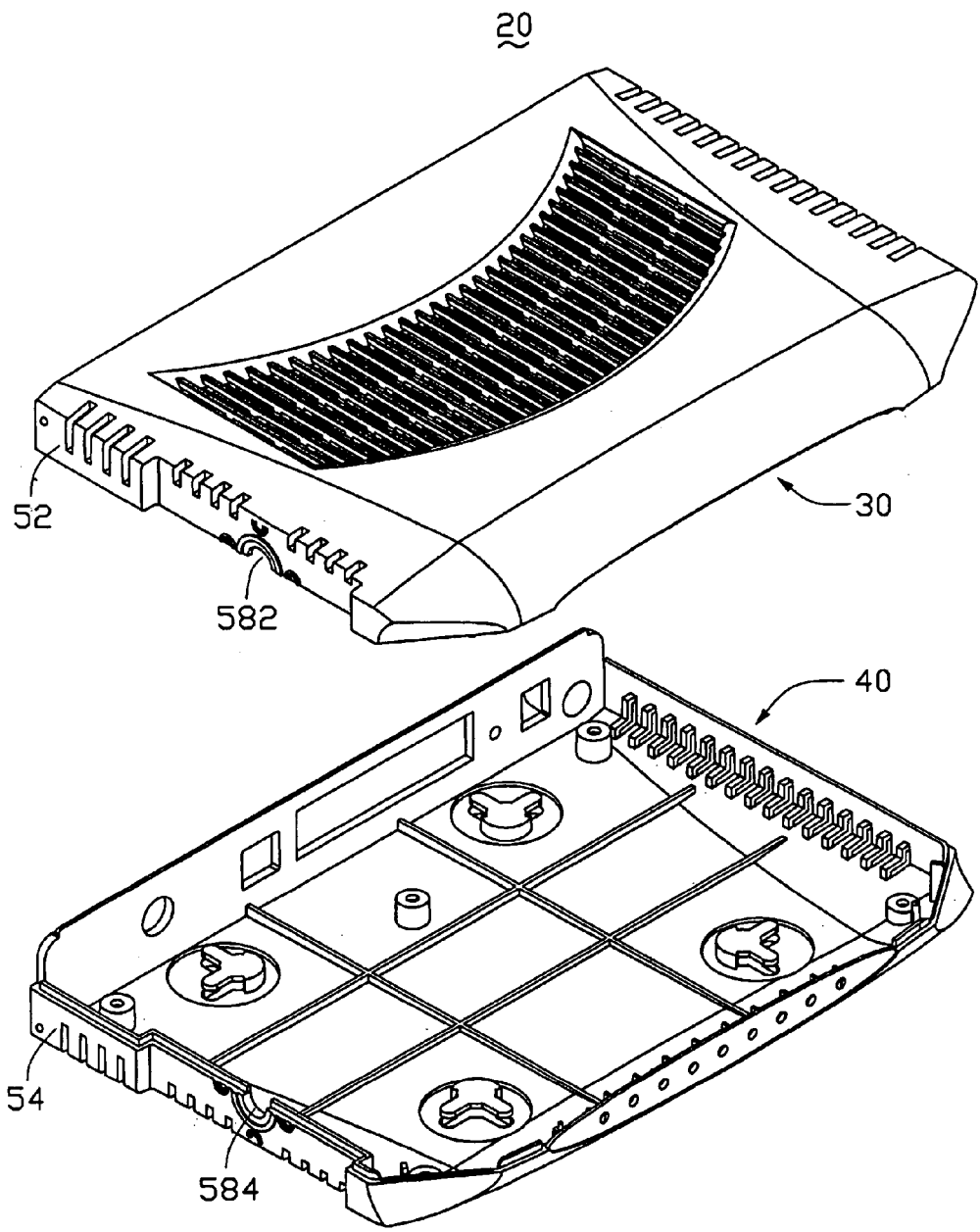
FIG. 4 is an exploded, isometric view of the case of the electronic device of FIG. 1, the case comprising a cover and a base.
Figure 5:
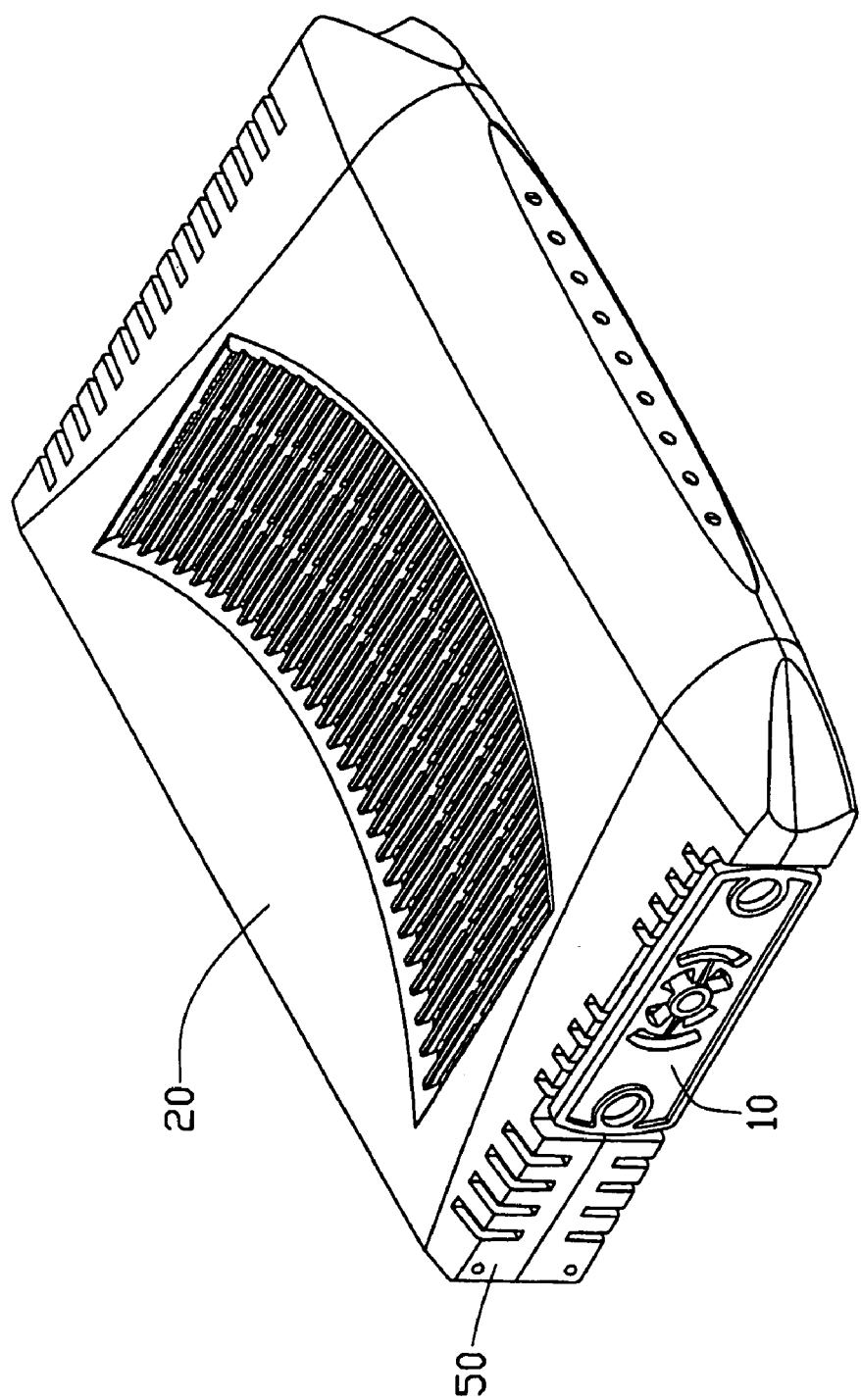
FIG. 5 is an assembled view of FIG. 1, showing the supporting member in a first position.
Figure 6:
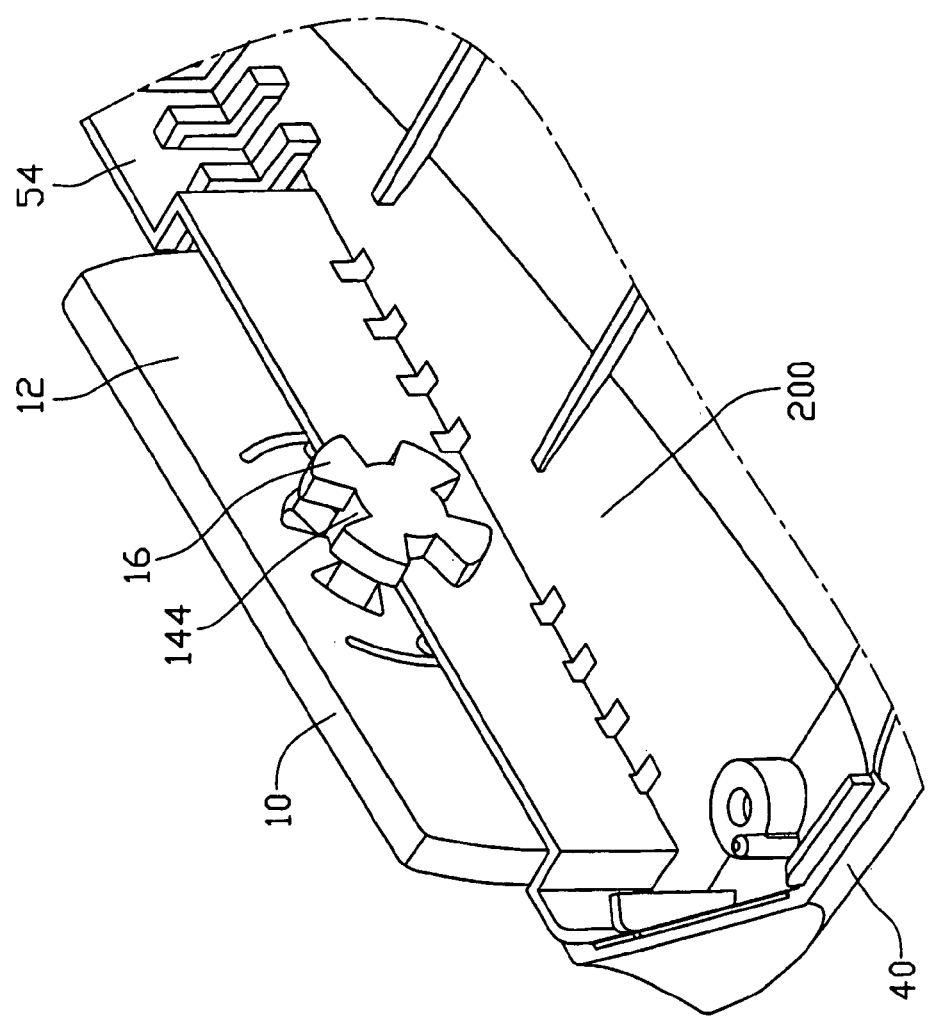
FIG. 6 is an enlarged, cut-away, isometric view of the supporting member and part of the base of the electronic device shown in FIG. 5, but viewed from another aspect.

As shown in FIGS. 1-2 and 4, the case 20 comprises a bottom wall 50, which itself comprises a first bottom wall portion 52 and a second bottom wall portion 54. The first bottom wall portion 52 is formed on the cover 30, and the second bottom wall portion 54 is formed on the base 40. A receiving recess 56 is defined in the bottom wall 50, for receiving the main portion 12 of the supporting member 10. A thickness of the main portion 12 is substantially equal to a depth of the receiving recess 56. A receiving hole 58 is defined in the bottom wall 50 at a middle of the receiving recess 56. The neck portion 142 of the connecting member 14 is rotatably received in the receiving hole 58. The receiving hole 58 comprises a first channel 582 defined in the first bottom wall portion 52, and a second channel 584 defined in the second bottom wall portion 54. A pair of transversely aligned first locating sockets 500 and a pair of longitudinally aligned second locating sockets 502 are formed in the bottom wall 50 at the receiving recess 56. The sockets 500 are formed by way of circular raised bushings respectively, and the sockets 502 are formed by way of semicircular raised bushings respectively. A half of each of the second sockets 502 is formed in the first bottom wall 52, and the other half of each of the second sockets 502 is formed in the second bottom wall 54. One of the first sockets 500 is formed in the first bottom wall 52, and the other first socket 500 is formed in the second bottom wall 54. The locating protrusions 126 can be selectively received in either the first sockets 500 or the second sockets 502. When this occurs, the locating protrusions 126 cannot freely slide out of the corresponding first sockets 500 or second sockets 502. The case 20 defines a chamber 200, which comprises a first half portion defined in the cover 30 and a second half portion defined in the base 40.

Referring to FIGS. 1-6, in assembly, the neck portion 142 of the connecting member 14 is placed in the second channel 584 of the second bottom wall portion 54, with corresponding of the protruding portions 16 being received in the second half portion of the chamber 200 at an inside of the second bottom wall portion 54. Then, the cover 30 is attached onto the base 40. The neck portion 142 of the connecting member 14 is thus also received in the first channel 582 of the first bottom wall portion 52, and corresponding of the protruding portions 16 are received in the first half portion of the chamber 200 at an inside of the first bottom wall portion 52. Thus the supporting member 10 is mounted to the case 20. In this position, the locating protrusions 126 of the supporting member 10 are received in the corresponding second sockets 502 of the case 20. The supporting member 10 is fully received in and aligned with the receiving recess 56 of the case 20, and is defined as being in a first position. In the first position, the electronic device is readily oriented in a horizontal position on a reference plane like a desktop or tabletop.

Figure 7:
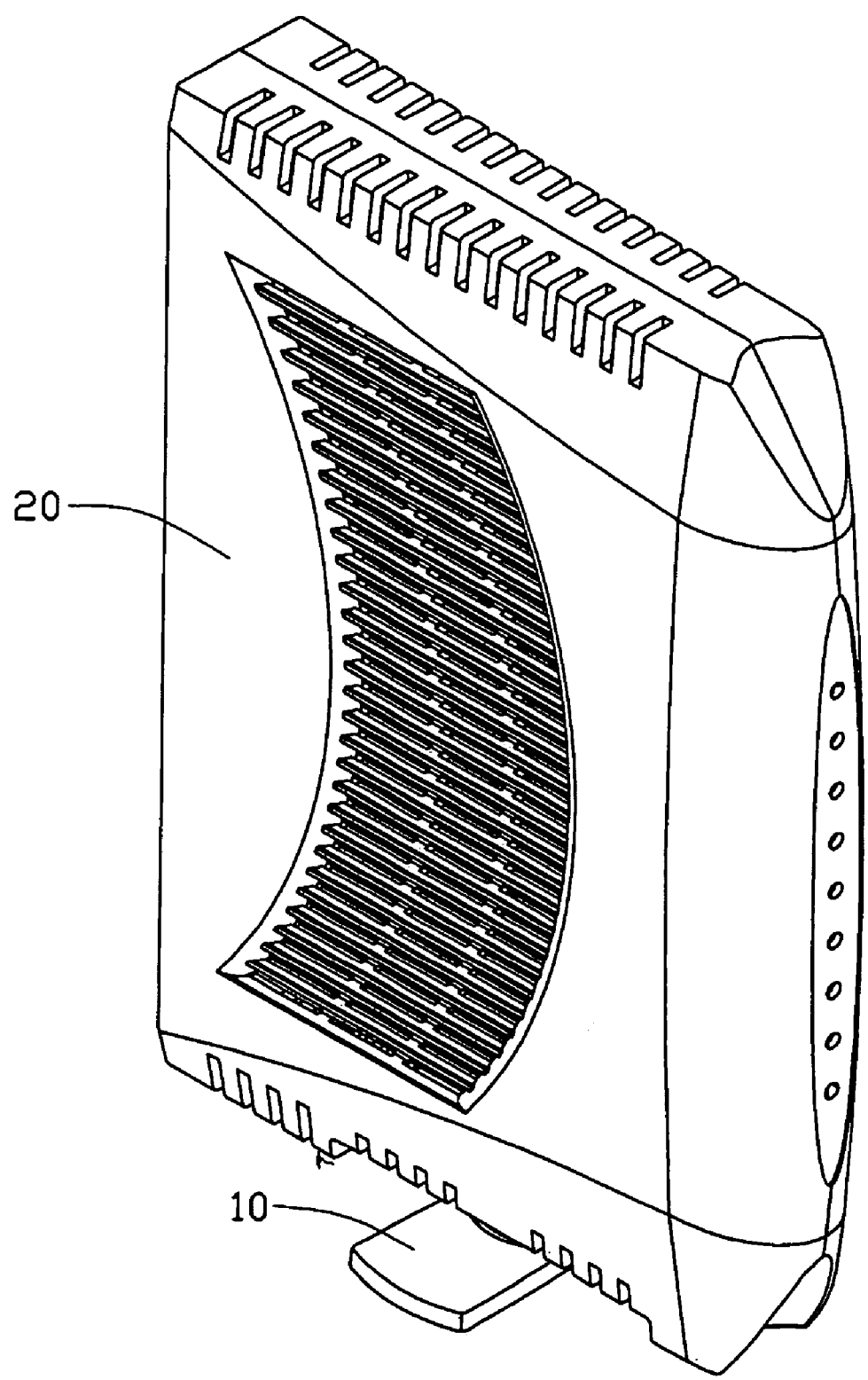
FIG. 7 is similar to FIG. 5, but showing the supporting member in a second position.

Referring also to FIG. 7, when the electronic device is to be used in an upright position, the supporting member 10 is rotated to a second position wherein the supporting member 10 is perpendicular to the receiving recess 56 of the case 20. In the second position, the locating protrusions 126 of the supporting member 10 are received in the first sockets 500 of the case 10, and the main portion 12 of the supporting member 10 is coplanar with opposite ends of the bottom wall 50. In the second position, the electronic device can be stood upright on the reference plane like the desktop or tabletop. The electronic device is maintained in position not only by the opposite ends of the bottom wall 50, but also by the transversely oriented supporting member 10. Thus, the electronic device is stably set in the upright position.

Because the locating protrusions 126 of the supporting member 10 cannot freely slide out of the corresponding first sockets 500 or second sockets 502 of the case 20, the supporting member 10 is stably held in the selected first position or second position. Therefore the electronic device is stably maintained in either the horizontal position or the upright position.

When the electronic device is in the horizontal position, the supporting member 10 is fully received in the receiving recess 56 of the case 20. Thus, the electronic device is compact and aesthetically pleasing. Further, because the supporting member 10 can be fully received in the receiving recess 56, packaging and transportation of the electronic device is easier. This helps reduce costs.

While various exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

I claim:

1. An electronic device comprising:
   a case comprising a bottom wall, the bottom wall defining a receiving recess, a receiving hole defined at the receiving recess, and at least two sockets at the receiving recess; and
   a supporting member rotatably mounted to the bottom wall at the receiving recess, the supporting member comprising a pair of locating protrusions receivable in a selected one or more of the sockets, a connecting portion rotatably received in the receiving hole, a main portion at one end of the connecting portion, at least one protruding portion at a periphery of an opposite end of the connecting portion, and a pair of slots adjacent to the locating protrusions respectively, the locating protrusions positioned on the main portion at opposite sides of the connecting portion;
   wherein when the electronic device is in a first position, the supporting member is at least substantially received in the receiving recess of the case; and when the electronic device is in a second position, the supporting member is substantially perpendicular to the receiving recess of the case.

2. The electronic device as claimed in claim 1, wherein the at least one protruding portion is a plurality of protruding portions.

3. The electronic device as claimed in claim 2, wherein each of the protruding portions has a fan blade shape.

4. The electronic device as claimed in claim 1, wherein the case further comprises a cover and a base, and the bottom wall comprises a first bottom wall portion formed with the cover and a second bottom wall portion formed with the base.

5. The electronic device as claimed in claim 4, wherein the at least two sockets are four sockets, which comprise a pair of transversely aligned first sockets and a pair of longitudinally aligned second sockets.

6. The electronic device as claimed in claim 5, wherein one of the first sockets is defined at the first bottom wall portion, and the other first socket is defined at the second bottom wall portion.

7. The electronic device as claimed in claim 5, wherein a half of each of the second sockets is defined at the first bottom wall portion, and the other half of each of the second sockets is defined at the second bottom wall portion.

8. A network communication device comprising:
   a case comprising a bottom wall, the bottom wall defining a receiving recess and a receiving hole at the receiving recess; and
   a supporting member mounted to the bottom wall, the supporting member comprising a connecting portion rotatably received in the receiving hole, a main portion at one end of the connecting portion, and one or more protruding portions at a periphery of an opposite end of the connecting portion, each of the protruding portions having a blade shape;
   wherein when the supporting member is in a first position, the supporting member is compactly contained in the case so that the case can be readily oriented in a horizontal position on a supporting surface; and when the supporting member is in a second position, the supporting member crosses the bottom wall so that the case can be stably stood in an upright position on a supporting surface.

9. The network device as claimed in claim 8, wherein the main portion comprises a pair of locating protrusions at opposite sides of the connecting portion, and a pair of slots at opposite sides of the connecting portion and adjacent to the locating protrusions respectively.

10. The network device as claimed in claim 9, wherein the bottom wall comprises a pair of transversely aligned first sockets and a pair of longitudinally aligned second sockets, and the locating protrusions are selectively received in either the first sockets or the second sockets.

11. The network device as claimed in claim 10, wherein the case further comprises a cover and a base, and the bottom wall comprises a first bottom wall portion formed with the cover and a second bottom wall portion formed with the base.

12. The network device as claimed in claim 11, wherein one of the first sockets is defined at the first bottom wall portion, and the other first socket is defined at the second bottom wall portion.

13. The network device as claimed in claim 11, wherein a half of each of the second sockets is defined at the first bottom wall portion, and the other half of each of the second sockets is defined at the second bottom wall portion.

14. An electronic device comprising:
   a case of said electronic device comprising a base and a cover separately formed from said base mechanically engagable with each other so as to enclose said electronic device therein together, said case defining a bottom wall thereof jointly formed by a part of said base and a part of said cover, and capable of abutting against a reference plane for placing said electronic device thereon along a predetermined orientation of said electronic device, said bottom wall comprising a pair of first sockets; and
   a supporting member removably attachable to said bottom wall of said case by means of movably engaging between said part of said base and said part of said cover, said supporting member movable relative to said case between a first position thereof where said supporting member snugly abuts against said bottom wall of said case, and a second position thereof where portions of said supporting member move away from said bottom wall of said case so as to enlarge an abutting area of said bottom wall of said case against said reference plane for steady placement of said electronic device thereon;
   wherein, one of the first sockets is defined at the part of the base, and the other first socket is defined at the part of the cover.

15. The electronic device as claimed in claim 14, wherein the bottom wall further comprises a pair of longitudinally aligned second sockets, and the first sockets are transversely aligned.

16. The electronic device as claimed in claim 15, wherein a half of each of the second sockets is defined at the part of the base, and the other half of each of the second sockets is defined at the part of the cover.

* * * * *